United States Patent
Kitamura et al.

(10) Patent No.: US 7,154,921 B2
(45) Date of Patent: Dec. 26, 2006

(54) LIGHT EMITTING ELEMENT DRIVING CIRCUIT, COMMUNICATION DEVICE AND LIGHT EMITTING ELEMENT DRIVING METHOD

(75) Inventors: Shojiro Kitamura, Fujimi-machi (JP); Tsugio Ide, Nagato-machi (JP); Yusuke Aritake, Chino (JP)

(73) Assignee: Seiko Epson Corporation, Tokyo (JP)

( * ) Notice: Subject to any disclaimer, the term of this patent is extended or adjusted under 35 U.S.C. 154(b) by 64 days.

(21) Appl. No.: 11/127,291

(22) Filed: May 12, 2005

(65) Prior Publication Data

US 2005/0269971 A1  Dec. 8, 2005

(30) Foreign Application Priority Data

Jun. 3, 2004  (JP)  ............................ 2004-165687

(51) Int. Cl.
  *H01S 3/10*  (2006.01)
(52) U.S. Cl. ............... 372/26; 372/34; 372/29.011; 372/38.07; 372/38.02; 315/291; 315/224; 315/169.3
(58) Field of Classification Search ............ 315/169.1, 315/169.3, 291, 224; 372/26, 33, 34, 29.011, 372/29.014, 29.015, 29.02, 29.021, 38.01, 372/38.02, 38.07, 43.01; 398/135, 137
See application file for complete search history.

(56) References Cited

U.S. PATENT DOCUMENTS 5,907,569 A * 5/1999 Glance et al. ......... 372/29.021
6,272,160 B1 * 8/2001 Stronczer ................. 372/38.02
6,532,245 B1 * 3/2003 Paschal et al. ........... 372/38.02
6,822,987 B1 * 11/2004 Diaz et al. ............... 372/38.02
6,922,423 B1 * 7/2005 Thornton ................. 372/38.07
6,975,658 B1 * 12/2005 Roach ...................... 372/29.02
7,049,759 B1 * 5/2006 Roach ........................ 315/224

FOREIGN PATENT DOCUMENTS

JP    A 11-330609    11/1999
JP    A 2002-261389    9/2002

OTHER PUBLICATIONS

"3.0V to 5.5V, 2-5Gbps VCSEL and Laser Driver," Maxim Integrated Products, Searched on May 11, 2004, Internet <URL: http://pdfserv.maxim.ic.com/en/ds/MAX3996.pdf,> pp. 1-16.

* cited by examiner

*Primary Examiner*—Haissa Philogene
(74) *Attorney, Agent, or Firm*—Oliff & Berridge, PLC

(57) ABSTRACT

A light emitting element driving circuit drives a surface-emitting element, and the light emitting element driving circuit is equipped with a bias current driving circuit that supplies a generally constant bias current to the surface-emitting element, a modulation current driving circuit that supplies to the surface-emitting element a modulation current superimposed on the bias current, and a temperature detection circuit that detects the temperature of the surface-emitting element, wherein the modulation current driving circuit decreases the current amount of the modulation current, when the temperature detected rises. The bias current driving circuit may preferably supply the bias current to the surface-emitting element through a coil, and the modulation current driving circuit may preferably supply the modulation current to the surface-emitting element through a capacitor.

10 Claims, 5 Drawing Sheets

LIGHT EMITTING ELEMENT DRIVING CIRCUIT, COMMUNICATION DEVICE AND LIGHT EMITTING ELEMENT DRIVING METHOD

BACKGROUND

The present invention relates to light emitting element driving circuits, communications devices, and light emitting element driving methods. In particular, the present invention relates to light emitting element driving circuits and light emitting element driving methods for driving surface-emitting elements, and communications devices equipped with the circuits.

The laser driving circuit described above changes the bias current based on the amount of emission light of the VCSEL, thereby driving the VCSEL in a manner that the amount of emission light therefrom becomes generally constant. The amount of emission light of the VCSEL decreases when the temperature rises. Therefore, when the amount of emission light decreases, the laser driving circuit increases the bias current to be supplied to the VCSEL, thereby keeping the amount of emission light at constant. Also, the laser driving circuit described above increases the modulation current to be superimposed on the bias current with an increase in the temperature.

[Non-patent Document 1] "+3.0 to +5.0, 2.5 Gbps VCSEL and Laser Driver", [online], Maxim Integrated Products, [Searched on May 11, 2004], Internet <URL: http://pdfserv-.maxim-ic.com/en/ds/MAX3996.pdf>

A communications device such as an optical transmission device that uses a VCSEL as a light source may be disposed in a place where the ambient temperature rises to a high temperature such as a device interior of a router or the like. In this case, because the conventional laser driving circuit described above increases the bias current and the modulation current with an elevation in the temperature of the VCSEL, a substantially large amount of current is supplied to the VCSEL. Accordingly, the conventional laser driving circuit described above has a problem in that the power consumption of the device having the VCSEL provided therein increases. Also, because an extremely large amount of current is supplied to the VCSEL, there are problems in that the VCSEL is rapidly deteriorated, and its service life is shortened.

Accordingly, it is an aspect of the present invention to provide light emitting element driving circuits, communications devices and light emitting element driving methods, which can solve the problems described above. This aspect can be achieved by combinations of the characteristics recited in independent claims in the Scope of Patent claims. Also, their dependent claims specify further advantageous concrete examples of the present invention.

SUMMARY

To solve the problems described above, in accordance with a first embodiment of the present invention, there is provided a light emitting element driving circuit characterized in comprising: a bias current driving circuit that supplies a generally constant bias current to a surface-emitting element; a modulation current driving circuit that supplies to the surface-emitting element a modulation current superimposed on the bias current; and a temperature detection circuit that detects a temperature of the surface-emitting element, wherein the modulation current driving circuit decreases the current amount of the modulation current, when the temperature detected rises.

With the structure described above, an average value of the current supplied to the surface-emitting element becomes generally constant regardless of changes in the temperature. In other words, even when the temperature of the surface-emitting element rises, the amount of the current supplied to the surface-emitting element becomes generally constant. Accordingly, according to the structure described above, the average current to be supplied to the surface-emitting element does not increase, such that a light emitting element driving circuit that has extremely small power consumption and can suppress deterioration of the surface-emitting element can be provided.

Also, with the structure described above, when the temperature rises, the modulation current to be supplied to the surface-emitting element is decreased. Accordingly, even when the threshold current of the surface-emitting element increases due to an increased temperature, an off-current to be supplied to the surface-emitting element when the surface-emitting element is in an off-state can be controlled according to the threshold current. In other words, even when the threshold current of the surface-emitting element increases, the off-current can be prevented from becoming substantially lower than the threshold current. Therefore, according to the structure described above, the extinction ratio of light emitted from the surface-emitting element can be sufficiently gained, and a turn-on delay occurring when the surface-emitting element is changed from an off-state to an on-state can be suppressed, such that there can be provided a light emitting element driving circuit that can make the surface-emitting element to emit a light signal having a good waveform quality with few jitters.

Also, in the above-described light emitting element driving circuit, the bias current driving circuit may preferably supply a current as the bias current such that an average amount of emission light of the surface-emitting element is within a predetermined range.

The above-described light emitting element driving circuit may preferably be further equipped with: a light-receiving element that receives light emitted from the surface-emitting element and generates a predetermined current; and an emission amount detection section that detects the average amount of emission light based on the predetermined current, and stops operations of the bias current driving circuit and the modulation current driving circuit to supply the bias current and the modulation current to the surface-emitting element. The predetermined current is proportional to the amount of received light.

According to the structure described above, when the average amount of emitted light of the surface-emitting element exceeds the specified range, the emission light operation of the surface-emitting element is stopped. Therefore, according to the structure described above, a light emitting element driving circuit that is highly reliable and safe can be provided.

In the above-described light emitting element driving circuit, the surface-emitting element may preferably be formed in one piece with the light-receiving element. Accordingly, a small-sized and inexpensive light emitting element driving circuit can be provided.

In the above-described light emitting element driving circuit, the bias current driving circuit may preferably supply the bias current to the surface-emitting element through an inductor, and the modulation current driving circuit may preferably supply the modulation current to the surface-emitting element through a capacitor. Accordingly, the modulation current can be superimposed onto the bias current.

In accordance with a second embodiment of the present invention, an optical communications device (optical transceiver) is equipped with the light emitting element driving circuit described above, and is composed of surface-emitting elements and other devices appropriately included therein. The optical communications device in accordance with the present invention can be used in a variety of electronic devices that perform data communications with external devices or the like, using light as a transmission medium, such as, for example, personal computers, so-called PDAs (portable data terminal devices) and the like. It is noted that, in the present application, the "optical communications device" not only includes a device including both of a structure for transmitting signal light (light emitting element, etc.) and a structure for receiving signal light (light-receiving element, etc.), but also a device equipped only with a structure for transmission (a so-called optical transmission module), and a device equipped only with a structure for reception (a so-called light-receiving module).

In accordance with a third embodiment of the present invention, there is provided a light emitting element driving method for driving a surface-emitting element, including: a step of supplying a generally constant bias current to the surface-emitting element; a step of supplying to the surface-emitting element a modulation current superimposed on the bias current; a step of detecting a temperature of the surface-emitting element; and a step of decreasing the current amount of the modulation current, when the temperature detected rises.

DETAILED DESCRIPTION OF EMBODIMENTS

Hereunder, the present invention is described by way of embodiments of the present invention with reference to the accompanying drawings. However, the embodiments below do not limit the invention concerning the scope of patent claims, and all of the combinations of the characteristics described in the embodiments are not necessarily indispensable for the invention's means to solve the problem.

Figure 1:
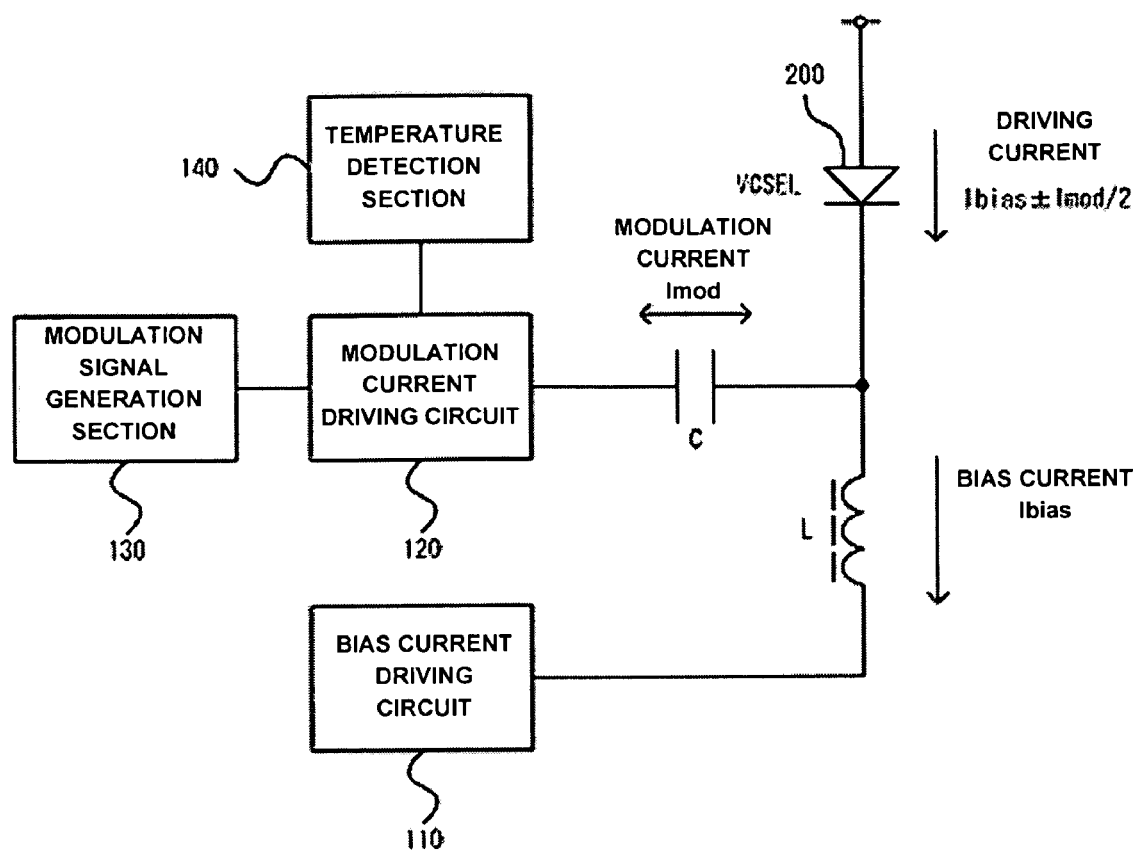
FIG. 1 is a diagram showing a first embodiment of a light emitting element driving circuit 100 of the present invention.

FIG. 1 is a diagram showing a first embodiment of a light emitting element driving circuit 100 in accordance with the present invention. The light emitting element driving circuit 100 is equipped with a bias current driving circuit 110, a modulation current driving circuit 120, a modulation signal generation section 130, a temperature detection section 140, a capacitor C, and a coil L. A surface-emitting element 200 that is driven by the light emitting element driving circuit 100 of the present embodiment may preferably be a light emitting element whose threshold current and slope efficiency have a small change against the temperature, such as, a vertical-cavity surface-emitting laser (VCSEL) or the like.

The bias current driving circuit 110 generates a bias current Ibias to be supplied to the surface-emitting element 200. Also, the bias current driving circuit 110 supplies the bias current Ibias to the surface-emitting element 200 through the coil L that is provided between the bias current driving circuit 110 and the surface-emitting element 200. In accordance with the present embodiment, the bias current driving circuit 110 generates a generally constant current as the bias current Ibias and supplies the same to the surface-emitting element 200.

The modulation current driving circuit 120 generates a modulation current Imod based on a modulation signal generated by the modulation signal generation section 130. Also, the modulation current driving circuit 120 superimposes the modulation current Imod, through the capacitor C, on the bias current Ibias generated by the bias current driving circuit 110, and supplies the same to the surface-emitting element 200.

Also, the modulation current driving circuit 120 controls the current amount of the modulation current Imod based on the temperature of the surface-emitting element 200 which is detected by the temperature detection section 140. Concretely, the modulation current driving circuit 120 decreases the current amount of the modulation current Imod, when the temperature of the surface-emitting element 200 rises.

Figure 2:
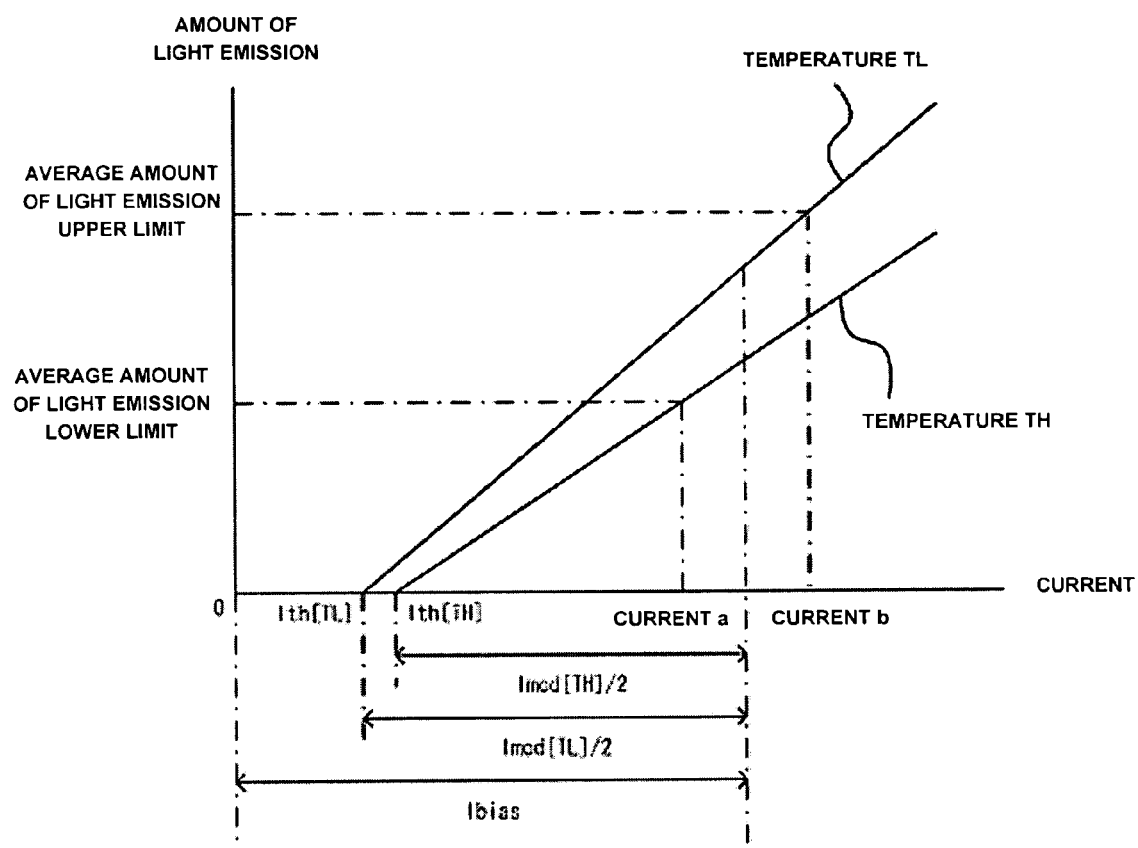
FIG. 2 is a graph showing the relation between the current that the light emitting element driving circuit 100 of the present embodiment supplies to a surface-emitting element 200 and the amount of emission light of the surface-emitting element 200.

FIG. 2 is a graph showing the relation between the current that the light emitting element driving circuit 100 of the present embodiment supplies to the surface-emitting element 200 and the amount of emission light of the surface-emitting element 200. Referring to FIG. 1 and FIG. 2, operations of the light emitting element driving circuit 100 of the present embodiment to control the bias current Ibias and the modulation current Imod are described. It is noted that FIG. 2 shows the relation between the current and the amount of emission light as an example at a temperature TL and a temperature TH that is higher than the temperature TL.

In accordance with the present embodiment, an average amount of emission light upper limit and an average amount of emission light lower limit which are respectively an upper limit and a lower limit of an average amount of emission light of the surface-emitting element 200 are defined. For example, the average amount of emission light upper limit and the average amount of emission light lower limit are set such that the average amount of emission light is within a range specified by the standard. The bias current driving circuit 100 generates the bias current Ibias in a manner that the average amount of emission light of the surface-emitting element 200 is set between the average amount of emission light upper limit and the average amount of emission light lower limit.

Concretely, a current a and a current b, which are currents to be supplied to the surface-emitting element 200 when the average amount of emission light of the surface-emitting element 200 becomes the average amount of emission light upper limit and the average amount of emission light lower limit, respectively, are set in advance. The bias current driving circuit 110 sets the bias current Ibias to be generally constant between the current a and the current b.

The modulation current driving circuit 120 controls the modulation current Imod to be superimposed on the bias current Ibias based on the temperature of the surface-emitting element 200 and the like which is detected by the temperature detection section 140. The modulation current Imod is a current in which a difference between a current value indicating a low level and a current value indicating a high level is Imod. Accordingly, the current to be supplied to the surface-emitting element 200 is Ibias+Imod/2, when the modulation signal indicates a high level, in other words, when the surface-emitting element 200 is in a on-state, and it is Ibias−Imod/2, when the modulation signal indicates a low level, in other words, when the surface-emitting element 200 is in an off-state. It is noted here that the amount of emission light, when the surface-emitting element 200 is in an off-state, may not be limited to zero, but may be any light amount that provides a predetermined extinction ratio against an on-state.

Also, the modulation current driving circuit 120 decreases the current amount of the modulation current Imod, when the temperature of the surface-emitting element 200 rises. In the present example, the modulation current driving circuit 120 superimposes Imod [TL] as the modulation current on the bias current Ibias when the temperature of the surface-emitting element 200 is at TL, and superimposes Imod [TH] that is smaller than Imod [TL] as the modulation current on the bias current Ibias when the temperature of the surface-emitting element 200 is at TH that is higher than TL.

It is noted here that the modulation current driving circuit 120 may preferably set the modulation currents Imod [TL] and Imod [TH] such that Ibias−Imod [TL]/2 and Ibias−Imod [TH]/2 become to be generally equal to threshold currents Ith [TL] and Ith [TH], respectively. Also, the modulation current driving circuit 120 may set the modulation currents Imod [TL] and Imod [TH] such that Ibias−Imod [TL]/2 and Ibias−Imod [TH]/2 become to be greater than the threshold currents Ith [TL] and Ith [TH], respectively.

Figure 3:
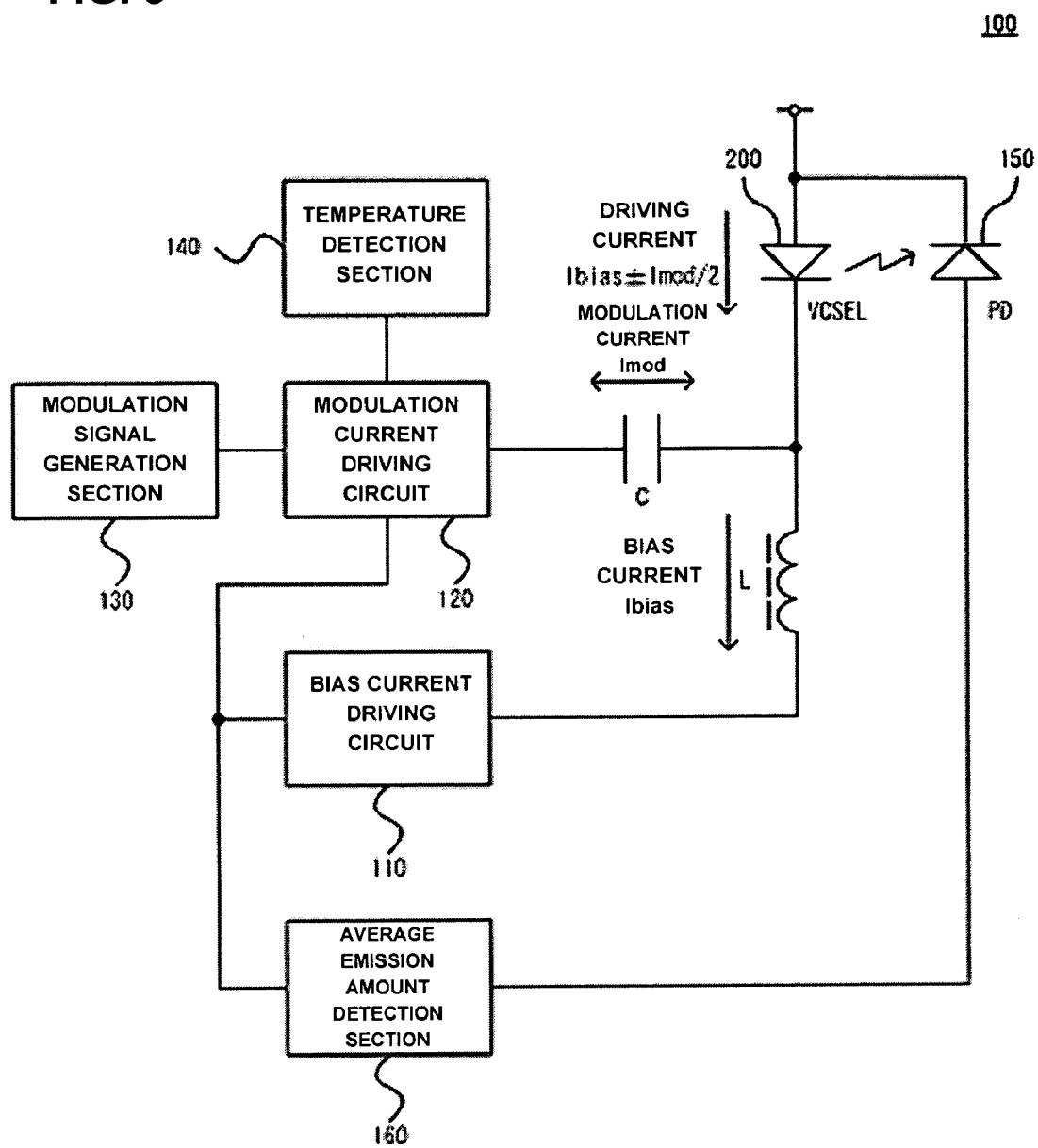
FIG. 3 is a diagram showing a second embodiment of the light emitting element driving circuit 100 of the present invention.

FIG. 3 is a diagram showing a second embodiment of the light emitting element driving circuit 100 of the present invention. Hereunder, the light emitting element driving circuit 100 of the second embodiment is described, focusing on differences from the first embodiment. It is noted that components appended with the same sings as those of the first embodiment have functions similar to those of the first embodiment.

The light emitting element driving circuit 100 of the present embodiment is further equipped with a light-receiving element 150 and an emission amount detection section 160, in addition to the composition of the first embodiment. The light-receiving element 150 receives light emitted from the surface-emitting element 200, and supplies to the emission amount detection section 160 a predetermined current based on the amount of light received. The predetermined current is proportional to the amount of light received. The emission amount detection section 160 judges, based on the predetermined current, as to whether the average amount of emission light of the surface-emitting element 200 is within a predetermined range.

When the emission amount detection section 160 judges that the average amount of emission light of the surface-emitting element 200 is not within the predetermined range, in other words, when it judges that the average amount of emission light exceeds the average amount of emission light upper limit or lower limit, it supplies a predetermined error signal to the bias current driving circuit 110 and the modulation current driving circuit 120. Upon receiving the error signal, the bias current driving circuit 110 and the modulation current driving circuit 120 stop supplying the bias current Ibias and the modulation current Imod to the surface-emitting element 200, respectively. By this, even when the temperature of the surface-emitting element 200 greatly changes, or when the amount of emission light greatly changes due to change of the surface-emitting element 200 with the lapse of time, the surface-emitting element 200 can be prevented from emitting an average amount of emission light that exceeds the upper limit or the lower limit, such that a light emitting element driving circuit with a high level of reliability and safety can be provided.

Figure 4:
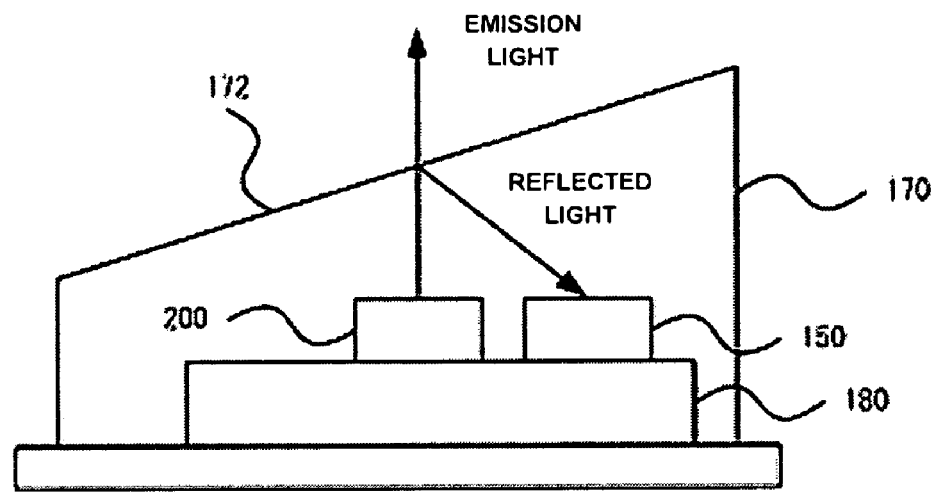
FIGS. 4(a) and 4(b) show views indicating examples of the structure in which the surface-emitting element 200 and the light-receiving element 150 shown in FIG. 3 are formed in one piece.
Figure 4:
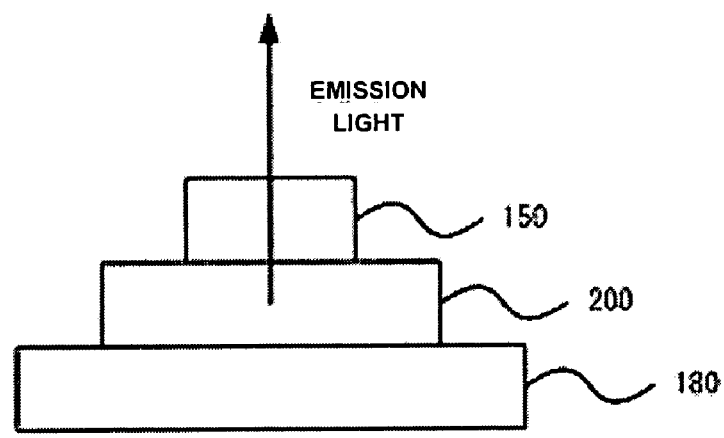

FIG. 4 are views showing examples of the structure in which the surface-emitting element 200 and the light-receiving element 150 shown in FIG. 3 are formed in one piece.

In the example of FIG. 4(*a*), the surface-emitting element 200 and the light-receiving element 150 are disposed on a common substrate 180 adjacent to each other in a direction generally perpendicular to an emission direction of emission light of the surface-emitting element 200. Also, a housing 170 that seals the surface-emitting element 200, the light-receiving element 150 and the substrate 180 is provided, and the surface-emitting element 200 emits light through the housing 170.

The housing 170 has a surface through which the emission light of the surface-emitting element 200 passes; and the surface is formed to have a predetermined angle with respect to the emission direction of the emission light. Concretely, the surface reflects a part of the emission light so that it enters the light-receiving element 150. The light-receiving element 150 supplies a predetermined current to the emission amount detection section 160 based on the reflected light entered (see FIG. 3).

In the example of FIG. 4(*b*), the surface-emitting element 200 and the light-receiving element 150 are laminated on a substrate 180 in an emission direction of emission light. Concretely, the surface-emitting element 200 is stacked in layer on the substrate 180, and the light-receiving element 150 is stacked in layer on the surface-emitting element 200. The surface-emitting element 200 emits light through the light-receiving element 150 in a direction in which the surface-emitting element 200 and the light-receiving element 150 are laminated. The light-receiving element 150 supplies a predetermined current to the emission amount detection section 160 based on the emission light that passes the light-receiving element 150 (see FIG. 3).

Figure 5:
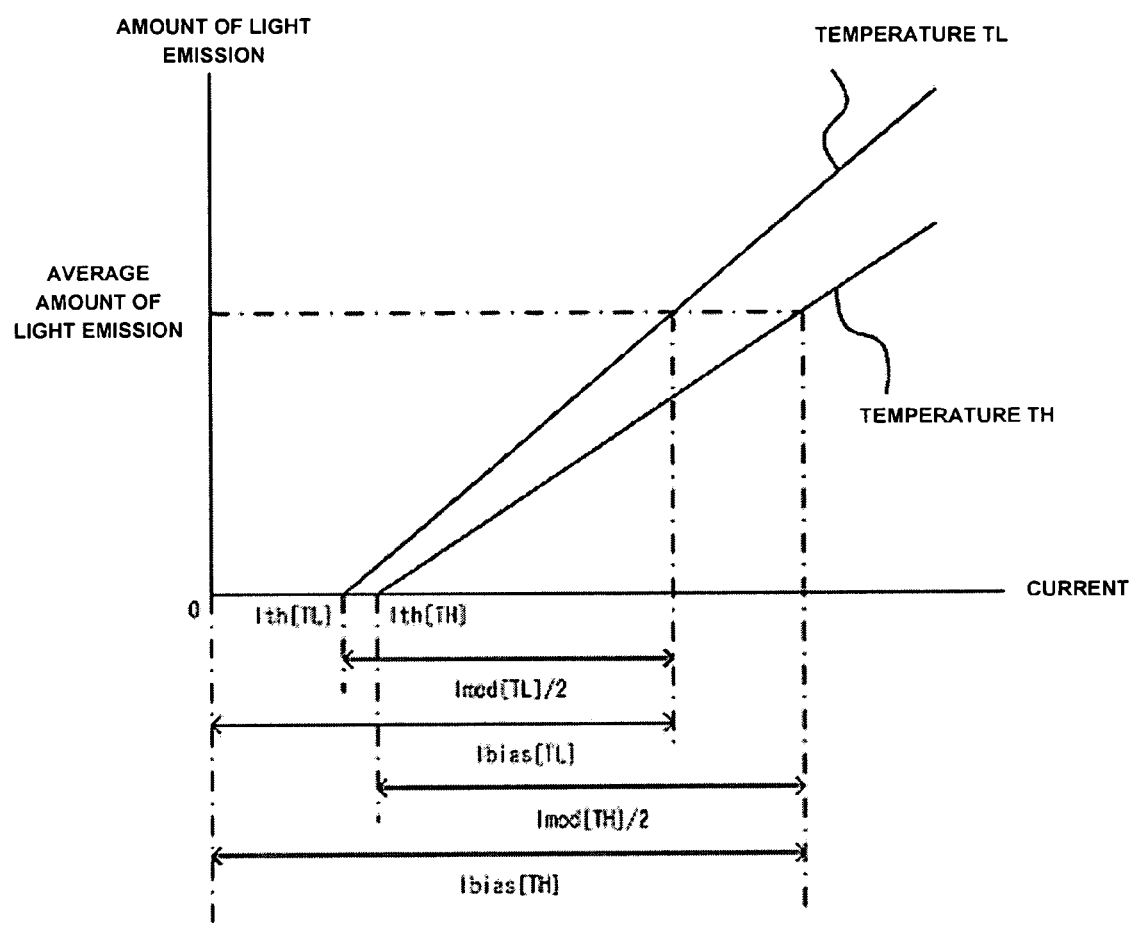
FIG. 5 is a graph showing the relation between the current and the amount of emission light in a comparison example.

FIG. 5 is a graph showing the relation between the current and the amount of emission light in a comparison example. In the comparison example, the bias current driving circuit 110 controls the bias current Ibias such that the average amount of emission light is constant regardless of the temperature of the surface-emitting element 200. In other words, when the temperature of the surface-emitting element 200 rises, the bias current Ibias is increased, thereby making the average amount of emission light constant. It is noted that FIG. 5 shows the relation between the current and the amount of emission light at a temperature TL and a temperature TH that is higher than the temperature TL. In the comparison example, as the temperature of the surface-emitting element 200 rises, the bias current Ibias to be supplied to the surface-emitting element 200 is increased.

Also, in the comparison example, when the bias current Ibias is made substantially large according to the temperature of the surface-emitting element 200, an off-current Ibias−Imod/2 to be supplied to the surface-emitting element 200 at the time of an off-state of the surface-emitting element 200 may substantially exceed the threshold current Ith, and a sufficient extinction ratio may not be obtained, unless the modulation current Imod is changed. Accordingly, in the comparison example, in order to obtain a sufficient extinction ratio, the modulation current Imod is increased with an increase in the bias current Ibias such that Ibias−Imod/2 becomes to be generally equal to the threshold current Ith.

In other words, in the comparison example, the bias current Ibias and the modulation current Imod to be supplied to the surface-emitting element 200 both increase with an increase in the temperature of the surface-emitting element 200. Accordingly, in the comparison example, the currents to be supplied to the surface-emitting element 200 increase with an increase in the temperature of the surface-emitting element 200 and/or a change thereof with the lapse of time.

On the other hand, according to the light emitting element driving circuit 100 of the first embodiment and the second embodiment, even when the threshold current Ith of the surface-emitting element 200 increases with an increase in the temperature of the surface-emitting element 200 and/or a change thereof with the lapse of time, the bias current driving circuit 110 sets the bias current Ibias generally constant, and the modulation current driving circuit 120 decreases the modulation current Imod, such that the current to be supplied to the surface-emitting element 200 can be prevented from increasing. Accordingly, in accordance with the present embodiment described above, the power consumption is extremely small, and deterioration of the surface-emitting element 200 can be suppressed.

Also, in accordance with the present embodiment described above, even when the threshold current of the surface-emitting element rises due to an elevation of the temperature, the off-current to be supplied to the surface-emitting element 200 at the time of an off-state of the surface-emitting element 200 can be controlled according to the threshold current. In other words, even when the threshold current of the surface-emitting element 200 rises, the off-current can be prevented from becoming substantially lower than the threshold current. Accordingly, in accordance with the present embodiment described above, the extinction ratio of light emitted from the surface-emitting element 200 can be sufficiently gained, and a turn-on delay occurring when the surface-emitting element 200 is changed from an off-state to an on-state can be suppressed, such that a light signal having a good waveform quality with few jitters can be emitted from the surface-emitting element 200.

The embodiment examples and application examples described by way of embodiments of the present invention described above can be used by appropriately combining them or adding changes and/or improvement to them according to usages, and the present invention is not limited to the descriptions of the embodiments described above. It is clear from the descriptions in the scope of claimed invention that these combinations or modes having changes and/or improvement added thereto can be included in the technical scope of the present invention.

What is claimed is:

1. A light emitting element driving circuit for driving a surface-emitting element, the light emitting element driving circuit comprising:
    a bias current driving circuit that supplies a generally constant bias current to the surface-emitting element;
    a modulation current driving circuit that supplies to the surface-emitting element a modulation current superimposed on the bias current; and
    a temperature detection circuit that detects a temperature of the surface-emitting element,
        wherein the modulation current driving circuit decreases the current amount of the modulation current, when the temperature detected rises.

2. A light emitting element driving circuit according to claim 1, wherein the bias current driving circuit supplies a current as the bias current such that an average amount of emission light of the surface-emitting element is within a predetermined range.

3. A light emitting element driving circuit according to claim 2, wherein further comprising:
    a light-receiving element that receives light emitted from the surface-emitting element and generates a predetermined current; and
    an emission amount detection section that detects the average amount of emission light based on the predetermined current, and stops operations of the bias current driving circuit and the modulation current driving circuit to supply the bias current and the modulation current to the surface-emitting element.

4. A light emitting element driving circuit according to claim 1, wherein the bias current driving circuit supplies the bias current to the surface-emitting element through an inductor, and
    the modulation current driving circuit supplies the modulation current to the surface-emitting element through a capacitor.

5. A light emitting element driving circuit according to claim 3, wherein the surface-emitting element is formed in one piece with the light-receiving element.

6. An optical communications device comprising the light emitting element driving circuit according to claim 1.

7. A light emitting element driving circuit according to claim 3, wherein the predetermined current is proportional to the amount of the light detected by the light-receiving element.

8. A light emitting element driving circuit according to claim 1, wherein
    Ibias−Imode/2>Ith
    where Ibias is the bias current, Imode is the modulation current, Ith is a threshold current of the surface-emitting element.

9. A light emitting element driving circuit according to claim 1, wherein
    Ibias−Imode/2=Ith
    where Ibias is the bias current, Imode is the modulation current, Ith is a threshold current of the surface-emitting element.

10. A light emitting element driving method for driving a surface-emitting element, the light emitting element driving method comprising:
    a step of supplying a generally constant bias current to the surface-emitting element;
    a step of supplying to the surface-emitting element a modulation current superimposed on the bias current;
    a step of detecting a temperature of the surface-emitting element; and
    a step of decreasing the current amount of the modulation current, when the temperature detected rises.

* * * * *